(12) United States Patent
Bobo et al.

(10) Patent No.: US 11,112,443 B2
(45) Date of Patent: Sep. 7, 2021

(54) SENSITIVE COMPONENT FOR DEVICE FOR MEASURING ELECTROMAGNETIC FIELD BY THERMOFLUORESCENCE, CORRESPONDING MEASUREMENT AND MANUFACTURING METHODS (71) Applicants: OFFICE NATIONAL D'ETUDES ET DE RECHERCHES AEROSPATIALES, Palaiseau (FR); INSTITUT NATIONAL DES SCIENCES APPLIQUEES DE TOULOUSE, Toulouse (FR); CENTRE NATIONAL DE LA RECHERCHE SCIENTIFIQUE, Paris (FR)

(72) Inventors: Jean-Francois Bobo, Gaillac-Toulza (FR); Julian Carrey, Palaminy (FR); Stephane Faure, Launaguet (FR); Francois Isaac, Villenouvelle (FR); Daniel Prost, Toulouse (FR)

(73) Assignee: OFFICE NATIONAL D'ETUDES ET DE RECHERCHES AEROSPATIALES, Palaiseau (FR)

( * ) Notice: Subject to any disclaimer, the term of this patent is extended or adjusted under 35 U.S.C. 154(b) by 0 days.

(21) Appl. No.: 16/650,753

(22) PCT Filed: Sep. 25, 2018

(86) PCT No.: PCT/EP2018/076028
§ 371 (c)(1),
(2) Date: Mar. 25, 2020

(87) PCT Pub. No.: WO2019/063572
PCT Pub. Date: Apr. 4, 2019

(65) Prior Publication Data
US 2020/0309835 A1 Oct. 1, 2020

(30) Foreign Application Priority Data

Sep. 26, 2017 (FR) ...................... 1758907

(51) Int. Cl.
*G01R 29/08* (2006.01)
*G01R 29/12* (2006.01)
*G01R 33/02* (2006.01)

(52) U.S. Cl.
CPC ......... *G01R 29/0885* (2013.01); *G01R 29/12* (2013.01); *G01R 33/0213* (2013.01)

(58) Field of Classification Search
CPC ................ G01R 29/0885; G01R 29/12; G01R 33/0213; G01R 33/02; G01R 33/0052; G01R 33/1284
(Continued)

(56) References Cited

U.S. PATENT DOCUMENTS 3,693,084 A * 9/1972 Augustine ............... G02F 1/132
324/106
4,263,061 A * 4/1981 Fatuzzo .................... G21K 4/00
148/276
(Continued)

FOREIGN PATENT DOCUMENTS

FR 2787583 A1 6/2000
WO 9008952 A1 8/1990

OTHER PUBLICATIONS

English translation of Written Opinion of the International Searching Authority dated Mar. 31, 2020 for corresponding International Application No. PCT/EP2018/076028, filed Sep. 25, 2018.
(Continued)

*Primary Examiner* — Christopher P McAndrew
(74) *Attorney, Agent, or Firm* — David D. Brush; Westman, Champlin & Koehler, P.A.

(57) ABSTRACT

A component sensitive to an electromagnetic field, which includes a first absorbent material, able to partially absorb
(Continued)

energy of a given electromagnetic field and converting the absorbed energy into heat. The sensitive component includes a second fluorescent and thermosensitive material, placed in contact with the first material in order to store the heat converted by the first material. The second material is able to re-emit, under the action of a predetermined excitation light, a light by fluorescence with light intensity dependent on the stored heat.

19 Claims, 3 Drawing Sheets

(58) Field of Classification Search
USPC .......................................................... 324/457
See application file for complete search history.

(56) References Cited

U.S. PATENT DOCUMENTS

| | | | | |
|---|---|---|---|---|
| 4,649,280 A | * | 3/1987 | Holland | G01N 21/643 250/368 |
| 5,110,216 A | | 5/1992 | Wickersheim et al. | |
| 5,658,673 A | * | 8/1997 | Holwitt | C03C 17/3405 428/413 |
| 6,982,431 B2 | * | 1/2006 | Modlin | G01N 21/253 250/225 |
| 2011/0152693 A1 | * | 6/2011 | Schweitzer | G01N 33/582 600/476 |
| 2013/0034122 A1 | * | 2/2013 | Lewis | G01K 11/3213 374/161 |
| 2020/0309835 A1 | * | 10/2020 | Bobo | G01R 29/12 |

OTHER PUBLICATIONS

International Search Report dated Nov. 20, 2018 for corresponding International Application No. PCT/EP2018/076028, filed Sep. 25, 2018.

Written Opinion of the International Searching Authority dated Nov. 20, 2018 for corresponding International Application No. PCT/EP2018/076028, filed Sep. 25, 2018.

* cited by examiner

SENSITIVE COMPONENT FOR DEVICE FOR MEASURING ELECTROMAGNETIC FIELD BY THERMOFLUORESCENCE, CORRESPONDING MEASUREMENT AND MANUFACTURING METHODS

1. CROSS-REFERENCE TO RELATED APPLICATIONS

This Application is a Section 371 National Stage Application of International Application No. PCT/EP2018/076028, filed Sep. 25, 2018, the content of which is incorporated herein by reference in its entirety, and published as WO 2019/063572 on Apr. 4, 2019, not in English.

2. FIELD OF THE INVENTION

The invention relates to the measurement of electromagnetic field.

More specifically the invention relates to a new design of the sensitive component of a device for measuring electromagnetic field, more commonly called an electromagnetic field sensor.

The invention has numerous applications, such as for example the characterisation of the electric and/or magnetic field of radiating systems such as radiotelephones, antennas, microwave transceivers, microwave devices, high-voltage lines, printed circuits, radar devices, induction devices, etc.

3. TECHNOLOGICAL BACKGROUND

The prior art electromagnetic field sensors, from which the present technology has been developed, comprise a component that is sensitive to the energy produced by an electromagnetic field, whose thermal properties are used to measure the electromagnetic field. This sensitive component comprises a thin coating of an absorbent material, able of partially absorbing the energy of the electromagnetic field to be measured and of converting this energy into heat. The heating of the absorbent material results in the emission of infrared light which is detected by an infrared camera equipping the sensor. The detected infrared light, converted for example into the form of a thermal image, is used to characterise the electromagnetic field in which the sensitive component is located. This known technique, called infrared thermography, is described in more detail in patent document FR2787583. It allows a two-dimensional or three-dimensional mapping of the electromagnetic field to be obtained by analysis of the infrared radiation produced by the sensitive component (technique also known as EMIR®).

However, the use of an infrared detector makes the electromagnetic sensor relatively costly.

In addition, this technique requires the presence of an electromagnetically and thermally neutral substrate to carry the absorbent material coating. Such a configuration is not always suitable for measuring the electromagnetic field of certain objects (for example objects producing a complex-shaped or little-known electromagnetic field).

4. SUMMARY OF THE INVENTION

In a particular embodiment of the invention, a component that is sensitive to an electromagnetic field is proposed, comprising: a first absorbent material, able of partially absorbing the energy from a given electromagnetic field and of converting the absorbed energy into heat, and a second fluorescent and thermosensitive material, placed in contact with said first material so as to store the heat converted by said first material, said second material being able of re-emitting, under the action of a predetermined excitation light, a light by fluorescence with light intensity dependent on the stored heat.

The invention is based on an ingenious approach consisting of taking advantage of the thermofluorescent properties of a fluorescent and thermosensitive material in order to measure electromagnetic fields. The invention consists of using the heating of the first material partially absorbing the energy from the electromagnetic field and of associating it with a second fluorescent material which is temperature sensitive, in order to characterise the electromagnetic field. This second material is able, when subjected to a predetermined excitation light, of re-emitting light by fluorescence, the intensity of which depends on the temperature of the first material.

"Absorbent material" is understood to mean a material partially absorbing the energy from the electromagnetic energy, that is to say absorbing between 1% and 20% of the energy from the electromagnetic field. "Placed in contact" is understood to mean that the second material is placed with respect to the first material so that there is a thermal transfer from the first material to the second. Finally, "electromagnetic field" is understood to mean that the sensitive component is sensitive to an electric and/or magnetic field.

According to the first specific implementation of the invention, the sensitive component takes the form of a structure of superposed coatings comprising a first coating of said first material and a second coating of said second material applied on said first coating.

This specific configuration is simple and inexpensive to implement. It should be noted that each coating of the first or second material is formed of at least one thin coating of this material.

According to a second specific implementation of the invention, the sensitive component takes the form of a coating in which said first and second materials are homogeneously mixed.

This specific configuration allows efficient diffusion of the thermal energy from the first material to the second material. The temperature measurements are therefore more representative of the temperature of the first material, thus rendering the electromagnetic field measurements more precise.

According to a particular embodiment of the component, said first material is a composite material comprising an electrically insulating matrix and electrically conductive particles. This particular embodiment is especially well adapted to measuring electric fields.

According to a variant embodiment, the first material is a composite material comprising an electrically insulating matrix and magnetic particles. This variant embodiment is especially well adapted to measuring magnetic fields.

According to a particular aspect of the invention, the first coating is configured in the form of a periodic array of pads of said first material, said first material being a magnetic or ferromagnetic material. This specific configuration improves the sensitivity of the magnetic field measurements.

According to a particular aspect of the invention, said second material comprises at least one compound belonging to the family of fluorophores.

According to a particular aspect of the invention, said second material is thermosensitive in a temperature range between −200 and +300 degrees Celsius. This range corresponds to the temperature conditions in space.

According to another aspect of the invention, said second material is thermosensitive in a temperature range between 10 and 40 degrees Celsius. This range corresponds to the ambient temperature conditions. The electromagnetic field measurements can thus be performed at ambient temperature.

According to a particular characteristic of the invention, the predetermined excitation light by fluorescence re-emitted have a different wavelength. Hence, this prevents overlapping the fluorescent material's excitation spectrum with its fluorescence emission spectrum. The fluorescent material will be preferably chosen so that the wavelength of the excitation light and the wavelength of the light by fluorescence are as far away from each other as possible, in order to facilitate the exploitation of the measurements.

According to a particular characteristic of the invention, the wavelength of the predetermined excitation light is in the 300 to 500 nm range, and in that the wavelength of the light by fluorescence has a wavelength in the 400 to 800 nm range. This offers the possibility to use a detector designed to detect light in the visible, which avoids the use of a traditional infrared detector which is relatively costly.

According to a particular aspect of the invention, said second material comprises a plurality of fluorescent compounds, each able to re-emit light by fluorescence with a different wavelength. This allows more precise electromagnetic field measurements to be obtained by determining the temperature of the component from relative light intensity values and not from absolute values. Hence, the light by fluorescence re-emitted by the sensitive component consists of as many wavelengths as there are different fluorescent compounds present in the second material, which improves the reliability of the electromagnetic field measurements.

In another particular embodiment of the invention, an electromagnetic field measuring device is proposed, comprising a sensitive component as previously defined in any of its different embodiments, said device also comprises: an excitation light source configured to emit said predetermined excitation light, and a light detector configured to receive light by fluorescence from said sensitive component, and so that the intensity of the light can be detected by received fluorescence.

The device according to the invention is less costly to implement than the traditional measuring devices using an infrared thermal detector. Indeed, a light detector for light with spectral band in the visible range (and thus less costly) is adapted to detecting light by fluorescence which can be re-emitted by the sensitive component.

According to a particular aspect of the invention, the device comprises a spectral filter configured to prevent the excitation light from the sensitive component or from the light source, from being received by the light sensor. Hence this increases the signal to noise ratio of fluorescence detected by the light detector, which gives more precise electromagnetic field measurements.

According to a particular implementation, the device comprises a multichannel optical fibre, the first end of which is connected to a face of the sensitive component, and the second end is connected to a module comprising said light detector and said excitation light source. Such a configuration allows local electromagnetic field measurements to be performed.

In another particular embodiment of the invention, an electromagnetic field measurement method is proposed, using a first absorbent material and a second fluorescent and thermosensitive material, said method being characterised in that it includes the following steps:

subject said sensitive component to the electromagnetic field so that said first material partially absorbs energy from the electromagnetic field and converts the absorbed energy into heat and so that said second material, placed in contact with said first material, stores the heat converted by said first material;

expose said sensitive component to a predetermined excitation light so that said second material re-emits a light by fluorescence, the luminous intensity of which depends on the stored heat.

detect the light by fluorescence re-emitted by said second material during the exposure of said sensitive component to the predetermined excitation light;

measure the electromagnetic field according to the intensity of the light by fluorescence detected.

Hence, the invention proposes a new method for measuring an electromagnetic field by thermofluorescence. Hence, the innovative nature resides in the fact of correlating the fluorescence intensity detected with the temperature of the sensitive component (that is to say the stored heat) in order to measure the electromagnetic field. "Measure the electromagnetic field" is understood to mean measuring an electric field and/or a magnetic field.

This other particular embodiment can be seen as a use of the sensitive component to measure an electromagnetic field: subjecting the sensitive component to the electromagnetic field to be measured, exposing the sensitive component to the excitation light to activate its fluorescence properties, detecting light by fluorescence re-emitted from the sensitive component and measuring an electromagnetic field according to the intensity of the light by fluorescence which has been detected.

In another particular embodiment of the invention, a method of manufacturing a component sensitive to an electromagnetic field is proposed, comprising a step for forming a first absorbent material, able of partially absorbing the energy of the electromagnetic field and of converting the absorbed energy into heat, and a second fluorescent and thermosensitive material, placed in contact with said first material in order to store the heat converted by said first material, said second material being able of re-emitting, under the action of a predetermined excitation light, a light by fluorescence with light intensity dependent on the stored heat.

According to a specific implementation, the formation step consists of applying a sprayable solution in which said first and second materials are homogeneously mixed, to form a coating of a homogeneous mixture of said first and second materials.

This formation step of the said first and second materials is particularly simple to implement. The use of a sprayable solution provides a "ready to use" sensitive component for measuring electromagnetic fields without having to use deposition techniques or machinery which are bulky, complex and costly. In addition, this step also enables the electromagnetic field measurement to be more easily adapted to all types of objects (and in particular to complex-shaped objects on which it is difficult to place a sensor).

According to an implementation variant, the formation step consists of successively applying a first sprayable solution comprising said first material and a second sprayable solution comprising said second material on the first solution applied, to form a structure of superposed coatings of said first and second materials.

This formation step of the first and second materials is particularly simple to implement. The use of a sprayable solution provides a "ready to use" sensitive component for measuring electromagnetic fields without having to use deposition techniques or machinery which are bulky, complex and costly. In addition, this step also enables the electromagnetic field measurement to be more easily adapted to all types of objects (in particular to complex shaped object).

According to another implementation variant, the formation step consists of the deposition of a coating solution in which said first and second materials are mixed, to form a coating of a homogeneous mixture of said first and second materials. Deposition techniques, such as spin coating, dip coating, drop casting or similar technique, are perfectly adapted to implement this step of the method.

According to another implementation variant, the formation step consists of the successive deposition of a first coating of said first material and a second coating of said second material on said first coating, to form a structure of superposed coatings of said first and second materials. Deposition techniques, such as spin coating, dip coating, drop casting or similar technique, are perfectly adapted to implement this step of the method. In another embodiment of the invention, a computer program product is proposed which comprises program code instructions for implementing the aforementioned measurement method (in any one of its different embodiments), when said program is executed on a computer.

In another embodiment of the invention, a storage medium is proposed which is computer-readable and non-transient, storing a computer program comprising a set of instructions executable by a computer to implement the aforementioned measurement method (in any one of its different embodiments).

5. LIST OF FIGURES

Other characteristics and advantages of the invention will emerge upon reading the following description, provided as a non-restrictive example, and the annexed drawings, wherein.

6. DETAILED DESCRIPTION

In all the figures of the present document, the identical elements and steps are designated by the same numerical reference.

The principle of the invention is based on an ingenious approach consisting of associating a first material, which has electromagnetic field absorption and heating properties, with a second material which has thermofluorescent properties in order to measure electromagnetic fields.

Figure 1:
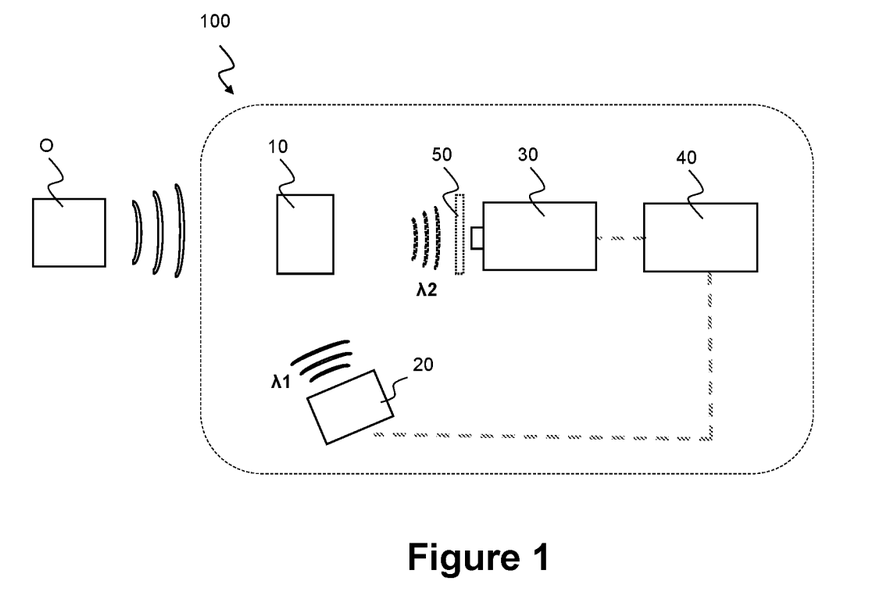
FIG. 1 shows a synoptic diagram of a measuring device according to a first particular embodiment of the invention.

We now show, in relation to FIG. 1, a synoptic diagram of a measuring device (or sensor) 100 according to a first particular embodiment of the invention. In this particular embodiment, the device 100 provides, by analysis of the fluorescence radiation, a two-dimensional or three-dimensional image of the electromagnetic field produced by an object O.

Device 100 comprises component 10 sensitive to the electromagnetic field, an excitation light source 20, a light detector 30 and a processing unit 40. The object O emits a radio frequency or microwave frequency electromagnetic radiation, between, for example, 1 kHz and 10 GHz. It may be, for example, a dedicated microwave source or a radiating system for which a mapping of the electromagnetic field is required.

The sensitive component 10 according to the invention comprises a first material, able of absorbing part of the energy of the electromagnetic field emitted by object O and able of converting this absorbed energy into heat (we also talk about heating or temperature increase of the material), and a second fluorescent and thermosensitive material, placed in contact with the absorbent material, also called fluorescent material.

"Absorbent material" is understood to mean a material partially absorbing the electromagnetic field's energy, that is to say absorbing between 1% and 20% of the electromagnetic field's energy.

"Placed in contact" is understood to mean that the fluorescent material is placed with respect to the absorbent material so that there is a thermal transfer from the absorbent material to the fluorescent material.

In this case, the idea consists of using the heating of the material absorbing the energy of the electromagnetic field emitted by object O and of associating it with a fluorescent material which is able of recovering and storing the heat converted by the absorbent material, in order to characterise the electromagnetic field. The fluorescent material of component 10 emits light by fluorescence (also sometimes called "fluorescent light") due to the action of an excitation light of given wavelength. Hence, by an analysis of the intensity of light by fluorescence re-emitted by the fluorescent material, which depends on the temperature variation of the absorbent material, it is possible to measure the amplitude of the electric or magnetic field.

The fluorescent material typically used belongs to the family of fluorophores emitting in the visible range (approximately 400 nm to 800 nm). The fluorescent material chosen here as an example in the remainder of the description is the chemical compound called Rhodamine B whose fluorescence wavelength is centred around 600 nm at ambient temperature (written $\lambda_2$ below) when this compound is subjected to a light with wavelength 470 nm (written $\lambda_1$ below). Naturally, this is given purely as an example and other materials could be used which are both fluorescent and thermosensitive. Generally, it is preferable to use a fluorescent material excitable under a wavelength between 300 and 500 nm, and emitting a light by fluorescence between 400 and 800 nm. In addition, a fluorescent material will be chosen which is thermosensitive in a range between −200 and +300 degrees Celsius, and more specifically between 10 and 40 degrees Celsius.

The absorbent material used depends on the type of field (electric or magnetic) to be measured. In practice, to prevent the absorbent material disrupting the electromagnetic field emitted by the object, it is chosen so that, for a given range of electromagnetic frequencies it only absorbs part of the electromagnetic energy but which is nevertheless sufficient to generate heating (that is to say a temperature increase) of said material perceptible by the fluorescent material.

When the measuring device 100 is in operation, the light source 20 emits excitation light for the fluorescent material. In the particular embodiment shown here, the light source 20 is a light-emitting diode which emits a blue light with wavelength λ equal to 470 nm. The light detector 30, for example a CCD or CMOS camera sensitive to the entire visible light spectrum, detects from the sensitive component 10 the visible light intensity it receives and converts it into an electric signal for the processing unit 40. The processing unit 40 is electrically connected to the light detector 30 on the one hand and to the light source 20 on the other hand. The spectral filter 50, for example of the high-pass 550 nm type, is associated with the light detector 30 to prevent the excitation light (with wavelength $\lambda_1$) from the light source 20 (directly of by reflection) from being received by the light detector 30, and therefore to allow it to receive the florescence light, with wavelength $\lambda_2$, re-emitted by the fluorescent material.

The use of a fluorescent material in the visible spectral band (approximately between 400 and 800 nm) offers the possibility to use a light detector sensitive to this spectral band, which has the advantage of being cheaper than the infrared light detectors used in the prior art solutions.

Figures 2, 3, 4:
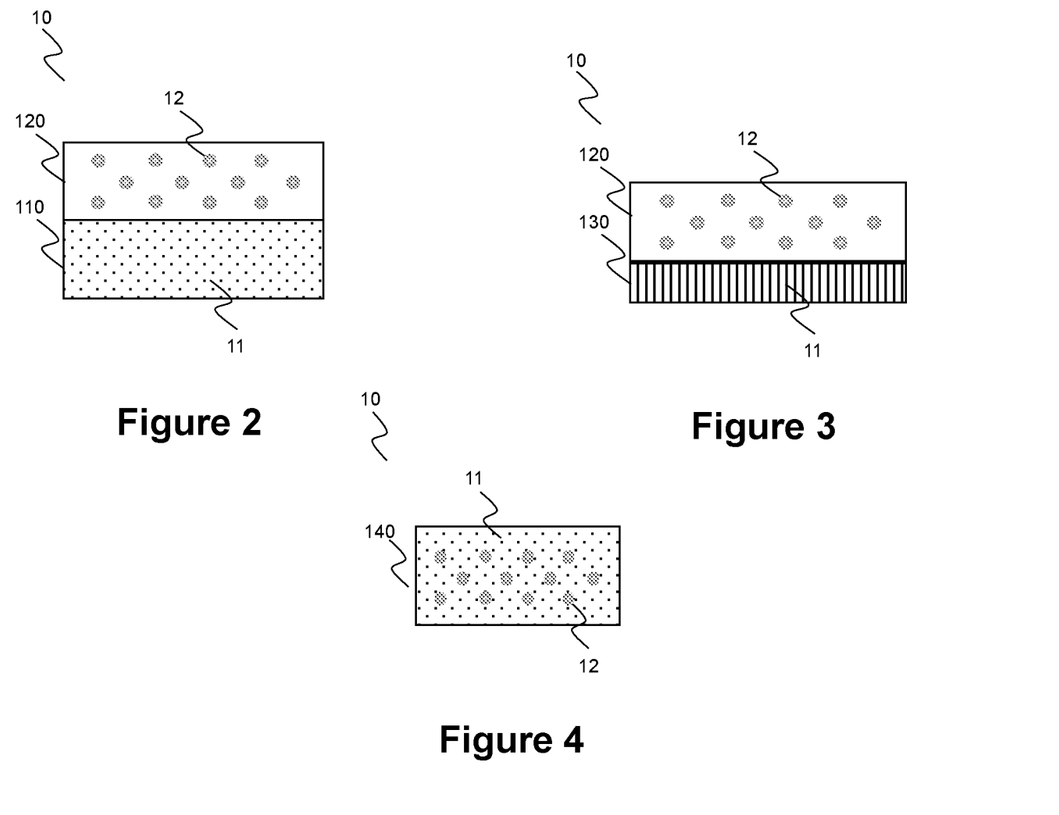
FIG. 2 shows the simplified diagrammatic structure of a sensitive component according to a first specific implementation of the invention.
FIG. 3 shows the simplified diagrammatic structure of a sensitive component according to a second specific implementation of the invention.
FIG. 4 shows the simplified diagrammatic structure of a sensitive component according to a third specific implementation of the invention.

Three examples of implementation of the sensitive component 10 according to the invention are shown in relation to FIGS. 2, 3 and 4. The absorbent material and the fluorescent material are referenced 11 and 12 respectively on these figures.

First Specific Implementation (FIG. 2)

According to the first specific implementation, the sensitive component 10 takes the form of a structure with thin superposed coatings. This structure comprises a coating 110 of absorbent material 11 on which is applied a thin coating 120 of fluorescent material 12. For example, the coating 120 is a thin coating of Rhodamine B, with thickness between 1 and 10 μm, applied (by spin coating for example) on a thin coating of absorbent composite material, such as Kapton® or Tokin® for example, with thickness between 10 and 500 μm. Kapton® is a material which consists of a polymer matrix charged with carbon particles and is particularly well adapted to electric field measurement. Tokin® is a material which consists of a polymer matrix charged with ferromagnetic particles and is particularly well adapted to magnetic field measurement.

Naturally, here too these are given purely as examples. For the measurement of electric fields, a composite material comprising an electrically insulating matrix and electrically conductive particles can be envisaged. For the measurement of magnetic fields, a composite material comprising an electrically insulating matrix and magnetic particles can be envisaged. Hence, it could be envisaged to integrate in the sensitive component a composite absorbent material integrating both an electric charge and a magnetic charge to completely measure the electromagnetic field.

It should be noted that the electrically conductive particulate filler must be adjusted so that the absorbent material has a "low" surface impedance, that is to say a surface impedance between 500 and 3000 Ω, so that it only absorbs part of the electric field. This surface impedance is adjusted according to the particle concentration in the insulating matrix and according to the thickness of the coating of absorbent material.

This superposed coating structure according to the invention can be produced in different ways.

A first way consists of successively depositing a first coating 110 of absorbent material 11 and a second coating 120 of fluorescent material 12 on the first coating 110, to form the superposed coating structure as shown in FIG. 2. To do this, the thin coating 110 of absorbent material is previously deposited on a substrate (not shown in the figure) which is electrically and/or magnetically neutral (in other words it is transparent to electric and/or magnetic waves according to the type of measurement to be performed) by a conventional deposition technique such as spin coating, dip coating or drop casting for example. Then a thin coating 120 of fluorescent material is applied on the thin coating 110 of absorbent material also by a conventional deposition technique. In order to prevent or reduce all risk of electromagnetic disturbance, a deposition of thin coatings without substrate can be used in priority.

A second way is to successively apply on a surface of the object O, a first sprayable solution of absorbent material 11 and a second sprayable solution of fluorescent material 12, to form the superposed coating structure as shown in FIG. 2. The use of a sprayable solution provides a "ready to use" sensitive component which adapts to all types of objects to be characterised. In particular, it avoids having to use machinery or a deposition technique which is bulky and unsuitable for the characterisation of certain objects. Finally, it avoids the use of a substrate which could significantly interfere with the electromagnetic field to be measured.

Second Specific Implementation (FIG. 3)

According to a second specific implementation, unlike the first implementation, the thin coating 120 is deposited (by spin coating for example) on a ferromagnetic patterned layer 130. This patterned layer 130 comprising a periodic array of ferromagnetic pads uniformly distributed on the surface of the substrate, each pad protrudes from the surface of the substrate. The shape, number and layout of the pads, and the proportion of the surface occupied by these pads can be adapted on a case by case basis according, in particular, to the dielectric and/or magnetic losses required in the coating of absorbent material used.

The thickness of this patterned layer is preferably between 100 and 500 nm, and is obtained for example using an electrostatic spraying technique using an Fe-Nickel alloy. Other absorbent magnetic materials adapted to the implementation of a patterned layer, can naturally be used without falling outside the scope of the invention.

This implementation is particularly well adapted to measuring magnetic fields.

Third Specific Implementation (FIG. 4)

According to a third specific implementation, the sensitive component 10 takes the form of a thin coating 140 in which the absorbent materials 11 and fluorescent materials 12 are homogeneously mixed. The thin coating 140 has a thickness typically between 10 and 500 μm, for example 50 μm. This specific configuration allows the efficient diffusion of the thermal energy from the absorbent material 11 to the fluorescent material 12, thus rendering the electromagnetic field measurement more precise.

As described previously, an electrically insulating matrix composite with electrically conductive particles can be used as absorbent material to measure electric fields. An electrically insulating matrix composite with magnetic particles (ferromagnetic for example) can be used to measure magnetic fields. However, in this specific implementation, the composite also comprises the fluorescent material 12, for example a fluorophore such as Rhodamine B.

This coating of mixed materials, according to the invention, can be formed in different ways.

A first way consists of applying on a substrate, by spin coating or dip coating-stretching, a deposition solution in which the absorbent material (polymer composite charged with magnetic particles for example) and the fluorescent material (rare earth-based or Rhodamine B-based fluorophores for example) are mixed to form a mixture coating 140. Deposition techniques, such as drop casting or similar technique are perfectly adapted to implement this step of the method. The substrate to be used must be substantially transparent to the electromagnetic field radiated by the object O.

A second way is to apply, on a surface of the object O, a sprayable solution in which the absorbent materials 11 and fluorescent materials 12, are homogeneously mixed to form the mixed coating 140. The use of a sprayable solution provides a "ready to use" sensitive component which adapts to all types of objects to be characterised. In particular, it avoids having to use machinery or a deposition technique which is bulky and unsuitable for the characterisation of certain objects. Finally, it avoids the use of a substrate which could significantly disrupt the electromagnetic field to be measured.

According to an advantageous characteristic, the fluorescent material 12 contains not just one compound but several compounds or fluorescent molecules each able of emitting a light by fluorescence with a different wavelength. For example, it could be envisaged to use a first fluorophore compound emitting a light by fluorescence with wavelength $\lambda_2$ and a second fluorophore compound emitting a light by fluorescence with wavelength $\lambda_3$ when these two compounds are subjected to the excitation light $\lambda_1$. The ratio of the two intensities of light by fluorescence, each associated with a different wavelength is directly proportional to the temperature of the material.

Figure 5:
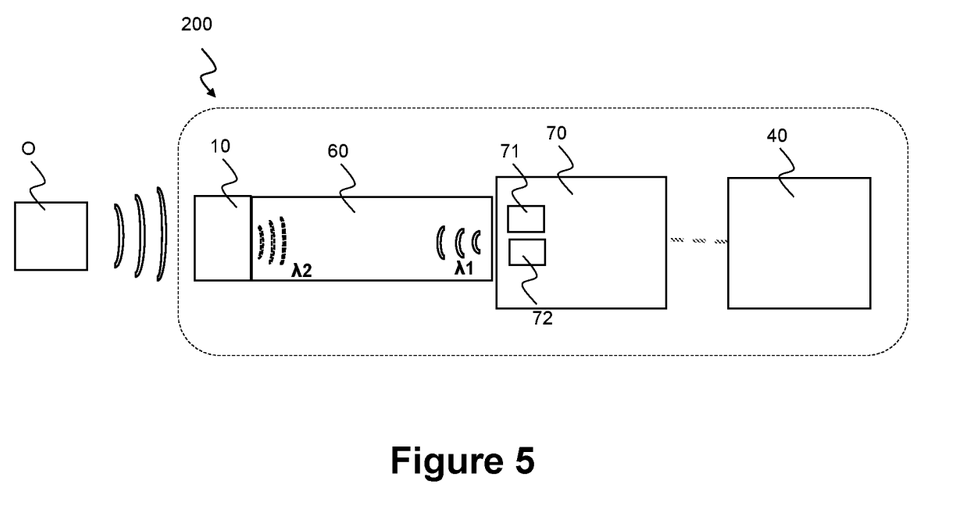
FIG. 5 shows a synoptic diagram of a measuring device according to a second particular embodiment of the invention.

Naturally, the measuring device 200 can, if necessary, be equipped with a second excitation light source dedicated to the second fluorophore compound if the first excitation light source 20 is unable to render fluorescent the second compound of the fluorescent material 12.

We now show, in relation to FIG. 5, a synoptic diagram of a measuring device 200 according to a second particular embodiment of the invention. In this particular embodiment, the device 200 can be used to take a local measurement of the electromagnetic field.

In this particular embodiment the device 200 comprises an aforementioned sensitive component 10 (in any of its different implementations), an emission/reception module 70, a processing unit 80 and a multichannel optical fibre 60 a first end of which is connected to a face of the sensitive component 10 and a second end is connected to the emission/reception module 70. The emission/reception module 70 is equipped with an excitation light source 71 with wavelength $\lambda_1$ (a light emitting diode for example) and a light detector 72 (a spectrometer or a photodiode for example) which is sensitive in the visible spectral band. The processing unit 80 is electrically connected to the emission/reception module 70. The processing unit 80 is identical to the processing unit 40 in FIG. 1.

The optical fibre 60 comprises a first optical channel configured to carry the excitation wavelength $\lambda_1$ (where $\lambda_1$=470 nm for example) generated by the excitation light source 71, and a second optical channel configured to carry the fluorescence wavelength $\lambda_2$ (where $\lambda_2$=600 nm for example) re-emitted by the fluorescent material subjected to the excitation, to the light detector 72. According to a particular implementation, the first optical channel is placed longitudinally on the periphery of the optical fibre and the second channel longitudinally in the core of the optical fibre.

According to a particular characteristic, an additional optical channel could be implemented in the optical fibre 60 to carry a second fluorescence wavelength ($\lambda_3$), for example if the light by fluorescence re-emitted by the fluorescent material 12 has two different wavelengths (presence of two fluorophore compounds or molecules in the fluorescent material 12). In this case, it could be envisaged to integrate in the module 70 a spectral filter cooperating with this additional optical channel to take into account this second fluorescence wavelength.

When the measuring device 200 is in operation, the emission/reception module 70 exposes, via the first optical channel, the fluorescent material 12 contained in the component 10 sensitive to the excitation light with wavelength $\lambda_1$. Due to the action of the excitation light, the fluorescent material 12 emits, via the second optical channel, light by fluorescence with wavelength $\lambda_2$ which is then detected by the detector contained in the emission/reception module 70. The intensity of the light by fluorescence detected depending on the temperature of the fluorescent material 12 allows the amplitude of the electromagnetic field to be determined. As in the first embodiment, the measurement method is performed by the measuring device's processing unit, the principle of which is detailed below in relation to FIG. 6.

Due to its optical fibre, the measuring device 200 has the advantage of being able to be inserted in a housing or a device in order to measure the electromagnetic field in it.

We describe below, in relation to FIG. 6, the main steps of the measurement method according to a particular embodiment of the invention. In this embodiment, the method is performed by the processing unit 40. The processing unit 40 is configured to control the light source 20 and the light detector 30, and to determine the amplitude of the electromagnetic field according to light signals received by the light detector 20.

It should be noted that if the object O is a dedicated microwave source, it can also be controlled by the processing unit 40 (via an electrical or wireless link).

At step 600, the sensitive component 10 is subjected to the electromagnetic field produced by the object O. As explained above, the absorbent material 11 absorbs part of the electromagnetic field's energy produced by the object O and converts it into heat. The fluorescent material 12 in contact with the absorbent material 11 then stores the heat converted by the absorbent material 11.

At step 610, the processing unit 40 activates the light source 20 in order to expose the sensitive component 10 to the excitation light with wavelength $\lambda_1$. The fluorescent material 12 then emits a light by fluorescence with wavelength $\lambda_2$ the light intensity of which depends on the temperature.

At step 620, the processing unit 40 activates the light detector 30 in order to capture the light by fluorescence with wavelength $\lambda_2$ re-emitted by the fluorescent material 12 during the exposure of the sensitive component 10 to the excitation light.

At step 630, the processing unit 40 measures the electromagnetic field according to the intensity of the light by fluorescence received by the light detector 30 (written $I_{fluo}$ below).

The inventors of the present exploit the fact that the intensity of the fluorescence light of a thermosensitive fluorescent material is closely linked to its temperature. Hence, it is the temperature variation (ΔT) given by the variation in intensity of the fluorescence light detected ($I_0-I_{fluo}$) which allows the amplitude of the electric field (E) to be estimated.

(i) Measurement and Mapping of the Electric Field:

To estimate the amplitude of the electric field (E), it is initially necessary to know the relationship linking this electric field to the electric surface power density ($P_{abs}$) absorbed by an absorbent material subjected to an electric wave. This relationship is given by the following equation:

$$P_{abs} = \frac{2Z_S}{(2Z_S + Z_0)} E^2 \quad (1)$$

where:
$Z_s$, surface impedance of the absorbent material (in Ω);
$Z_0$, impedance of the vacuum (in Ω);
E, amplitude of the electric field to which the absorbent material is subjected (in V/m).

In addition, the electric surface power density absorbed is itself linked to the temperature variation (ΔT) to which the material is subjected (that is to say the quantity of heat stored by the material) according to the following formulation:

$$\Delta T = \frac{P_{abs}}{2h} \quad (2)$$

where:
$P_{abs}$, the electric surface power density absorbed by the absorbent material (in W/m²);
h, the convection coefficient (in W/m²K).

Certain fluorescent materials emit light whose fluorescence light intensity varies according to their temperature. This dependence can be expressed as follows:

$$\Delta T = f(\Delta I) \quad (3)$$

where:
h, the difference between the temperature of the absorbent material when no electric field is present (h) and the temperature of the absorbent material when an electric field is present ($T_1$);
ΔI, the difference between the intensity of the fluorescence light measured when no electric field is present ($I_0$) and the intensity of the fluorescence light measured when an electric field is present ($I_{fluo}$);
ƒ, a monotone function defining the thermofluorescence behaviour of the fluorescent material and whose characteristics are obtained empirically.

In the case of Rhodamine B-based fluorescent material for example, the intensity of the fluorescence light varies by around −1% per degree Celsius.

From equations (1), (2) and (3) above, the processing unit 40 estimates the amplitude E of the electric field (in V/m) to which the sensitive component 10 is subjected, using the following equation:

$$E = \sqrt{\frac{I_0 - I_{fluo}}{a}} \quad (4)$$

where:
$I_{fluo}$, the intensity of the light by fluorescence detected by the light detector 30 when an electric field is present (in W/m²);
$I_0$, the intensity of the light by fluorescence detected by the light detector 30 when no electric field is present (reference intensity expressed in W/m²);
α, a calibration coefficient for the electric field measurement, dependent of the function f and on parameters h, $Z_s$, $Z_0$.

In practice, the value of the calibration coefficient α is obtained by calibration of the measuring device.

Hence, this invention proposes an electric field measurement by simply measuring the intensity of the fluorescence light emitted by the sensitive component 10. The processing unit 40 processes all the data relating to the fluorescence intensity measured by the light detector and then provides a mapping of the electric field emitted by the object O.

(ii) Measurement and Mapping of the Magnetic Field:

To estimate the amplitude of the magnetic field (H), it is initially necessary to know the relationship linking this magnetic field to the magnetic surface power density ($P_{abs}$) absorbed by an absorbent material subjected to a magnetic wave. This relationship is given by the following equation:

$$P_{abs} = \mu_0 \cdot \pi \cdot \chi''(H) \cdot v \cdot H^2 \cdot e \quad (5)$$

where:
H, the amplitude of the magnetic field to which the absorbent material is subjected (in A/m);
v, the frequency of the magnetic field to which the absorbent material is subjected (in Hz);
$\chi''(H)$, the imaginary part of the magnetic susceptibility (unitless);
$\mu_0$, the magnetic permeability of the vacuum (kg·m·A⁻²·s⁻²); and
e, the thickness of the film (in m).

Let us consider, as previously, as an example, the use of a Rhodamine B-based fluorescent material. Thus, from equations (2), (3) and (5) above, the processing unit 40 estimates the amplitude H of the magnetic field (in A/m) to which the sensitive component 10 is subjected, using the following equation:

$$H = \sqrt{\frac{I_0 - I_{fluo}}{b}} \quad (6)$$

where:
$I_{fluo}$, the intensity of the light by fluorescence detected by the light detector 30 when a magnetic field is present (in W/m²);
$I_0$, the intensity of the light by fluorescence detected by the light detector 30 when no magnetic field is present (reference intensity expressed in W/m²);
b calibration coefficient for the magnetic field measurement, dependent of the function f and on parameters h, $\chi''$ (H) et v In practice, the value of the calibration coefficient b is obtained by calibration of the measuring device.

Hence, this invention proposes a magnetic field measurement by simply measuring the intensity of the fluorescence light emitted by the sensitive component 10. The processing unit 40 processes all the data relating to the fluorescence intensity measured by the light detector and then provides a mapping of the magnetic field emitted by the object O.

Hence, the principle here is to use the sensitive component to measure the electromagnetic field (subject it to the electromagnetic field, expose it to an excitation light, detect the fluorescence re-emitted by it).

In the specific case where the fluorescent material 12 comprises a plurality of fluorescent compounds, such as, for example, a first fluorophore compound emitting a light by fluorescence with wavelength $\lambda_2$ and a second fluorophore compound emitting a light by fluorescence with wavelength $\lambda_3$ when subjected to the excitation light. In this case, the dependency of the intensity of the fluorescence light and of the temperature can be expressed as follows:

$$T = f'\left(\frac{I_2}{I_3}\right)$$

where:
$I_3$, the intensity of the fluorescence light emitted by the first fluorophore compound;
$I_3$, the intensity of the fluorescence light emitted by the second fluorophore compound;
f', a monotone function defining the thermofluorescence behaviour of the fluorescent material containing the first and second fluorophore compounds and whose characteristics are obtained experimentally according to the physical properties of these two compounds.

The ratio of the two light intensities by fluorescence is directly proportional to the temperature of the material, which enables the amplitude of the electric or magnetic field emitted by the object O to be deduced. Other methods of estimating the temperature of a multi-fluorophore sensitive component by fluorescence can be used to measure the associated electromagnetic field, without falling outside the scope of the invention. As an example, it could be envisaged to estimate the temperature of the sensitive component based on its spectral characteristics. The monotone function discussed above could be established based on the Full Width at Half Maximum (FWHM) ratio of the fluorescence light peaks emitted by the fluorophore compounds and of their wavelength offset.

According to a specific implementation, on the emission side, the processing unit 40 modulates the amplitude of the excitation light, and on the reception side, the processing unit 40 synchronously demodulates the fluorescence light detected by the light detector. Coupling an optical modulation of the excitation light with a demodulation of the fluorescence intensity measurement increases the signal to noise ratio of the optical signal detected by the light detector and thus improves the precision of the fluorescence intensity measurement.

Figure 7:
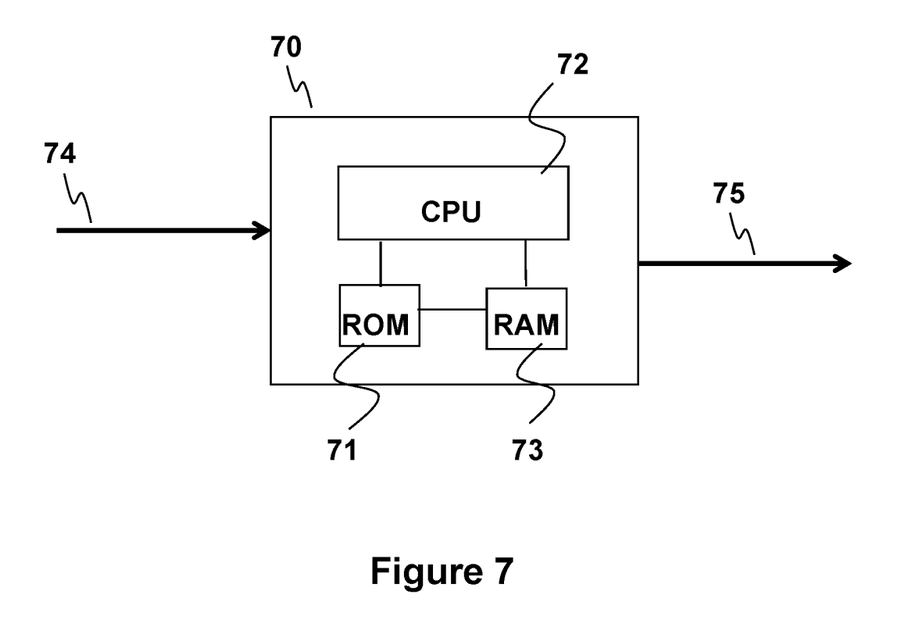
FIG. 7 shows the structure of a processing unit implementing the measurement method, according to a particular embodiment of the invention.

FIG. 7 shows the simplified structure of a processing unit implementing the measurement method according to the invention (for example the first particular embodiment described above in relation to FIG. 1). This module has a Random Access Memory (RAM memory) 73, a processing unit 72, equipped for example with a processor, and is controlled by a computer program stored in a Read Only Memory (for example a ROM memory or a hard disk). At initialisation, the code instructions of the computer program are for example loaded into a RAM memory 73 before being executed by the processor of the processing unit 72. The processing unit 72 receives instructions for the initialisation of the method (arrow 74), and activates the light source (to exposer/excite the sensitive component) and the light detector of the measuring device to detect the light by fluorescence re-emitted by the sensitive component (which can consist of several different wavelengths according the number of fluorescent compounds contained in the thermosensitive fluorescent material)). The processor of the processing unit 72 processes the data relating to the fluorescence light detected by the light detector and provides a two-dimensional or three-dimensional mapping of the electromagnetic field (arrow 75) according to the program's instructions.

Figure 6:
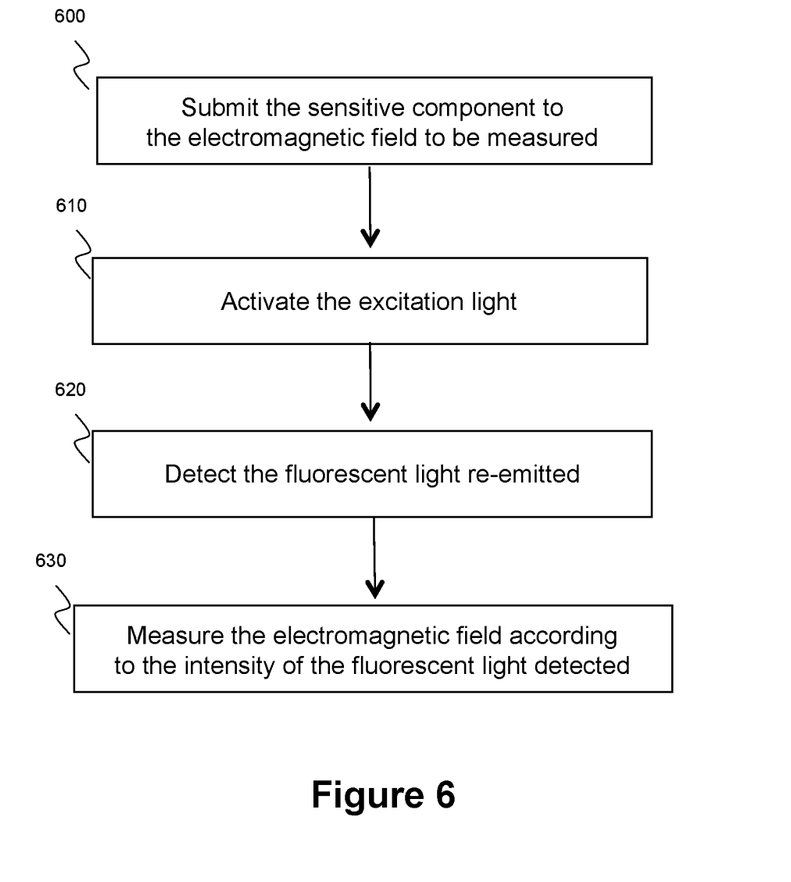
FIG. 6 shows a generic flow chart of a particular embodiment of the method according to the invention.

This FIG. 7 only illustrates one specific way, among several possibilities, to realise the algorithm detailed above, in relation to FIG. 6. Indeed, the measurement method of the invention is performed:
either on a reprogrammable calculating machine (a PC computer, a DSP processor or a microcontroller) executing a program consisting of a sequence of instructions,
or on a dedicated calculating machine (for example a logic gate array such as an FPGA or an ASIC, or any other hardware module).

When the invention is implanted on a reprogrammable calculating machine, the corresponding program (that is to say the sequence of instructions) can be stored in a removable storage medium (such as for example a floppy disk, a CD-ROM or a DVD-ROM) or not, this storage medium being partially or totally readable by a computer or a processor.

Hence, the term "module" in this document can correspond either to a software component or a hardware component, or to a set of hardware and software components.

At least one embodiment of the present disclosure overcomes the different disadvantages of the prior art.

More specifically, at least one embodiment provides an inexpensive electromagnetic field sensor.

At least one embodiment provides an electromagnetic field sensor manufacturing technique that is easy to implement and inexpensive.

At least one embodiment provides a wide spectral band technique for measuring electromagnetic field.

At least one embodiment provides an electromagnetic field measuring technique that is adaptable to all types of structures or objects.

At least one embodiment of the disclosure provides a simple and inexpensive two-dimensional or three-dimensional technique for visualising electromagnetic fields.

Although the present disclosure has been described with reference to one or more examples, workers skilled in the art will recognize that changes may be made in form and detail without departing from the scope of the disclosure and/or the appended claims.

The invention claimed is:

1. A component sensitive to an electromagnetic field, comprising:
a first absorbent material able to absorb energy of a given electromagnetic field and convert the absorbed energy into heat;
a second fluorescent and thermosensitive material placed in contact with said first material in order to store the heat converted by said first material, said second material being able to re-emit, under action of a predetermined excitation light, a light by fluorescence of light intensity dependent on the stored heat, wherein said second material comprises a plurality of fluorescent compounds, each able to re-emit a light by fluorescence of a different wavelength.

2. The component according to claim 1, wherein the component takes the form of a superposed coating structure comprising a first coating of said first material and a second coating of said second material applied on said first coating.

3. The component according to claim 1, wherein the component takes the form of a coating in which said first and second materials are homogeneously mixed.

4. The component according to claim 1, wherein said first material is a composite material comprising an electrically insulating matrix and electrically conductive particles.

5. The component according to claim 1, wherein said first material is a composite material comprising an electrically insulating matrix and magnetic particles.

6. The component according to claim 2, wherein the first coating is configured in the form of a periodic array of pads of said first material, said first material being a magnetic material.

7. The component according to claim 1, wherein said second material comprises at least one component belonging to the family of fluorophores.

8. The component according to claim 1, wherein said second material is thermosensitive in a temperature range between −200 and +300 degrees Celsius, and more specifically between 10 and 40 degrees Celsius.

9. The component according to claim 1, wherein the predetermined excitation light and the light by fluorescence re-emitted by said second material have different respective wavelengths.

10. The component according to claim 9, wherein the wavelength of the predetermined excitation light is in the 300 to 500 nm range and the wavelength of the light by fluorescence has a wavelength in the 400 to 800 nm range.

11. A device for measuring an electromagnetic field, wherein the device comprises:
the sensitive component as defined according to claim 1;
a light source configured to emit said predetermined excitation light;
a light detector configured to receive, from said sensitive component, light by fluorescence, and to detect the light intensity by received fluorescence.

12. The device according to claim 11, wherein the device comprises a spectral filter configured to prevent the excitation light from the sensitive component or from the light source, from being received by the light sensor.

13. The device according to claim 11, which further comprises a multichannel optical fibre, a first end of which is connected to a face of the sensitive component, and a second end of which is connected to a module comprising said light detector and said excitation light source.

14. A method for measuring an electromagnetic field by a sensitive component comprising a first absorbent material and a second fluorescent and thermosensitive material, said second material comprising a plurality of fluorescent compounds, each able to re-emit light by fluorescence with a different wavelength, said method comprising:
exposing said sensitive component, subjected to the electromagnetic field, to a predetermined excitation light;
detecting the light by fluorescence re-emitted by said second material during the exposure of said sensitive component to the predetermined excitation light; and
measuring the electromagnetic field according to an intensity of the light by fluorescence detected.

15. A method of manufacturing a component sensitive to an electromagnetic field, comprising the following acts:
forming a first absorbent material, able to absorb energy of the electromagnetic field and convert the energy absorbed into heat; and
forming a second fluorescent and thermosensitive material, placed in contact with said first material in order to store the heat converted by said first material, said second material being able to re-emit, under action of a predetermined excitation light, a light by fluorescence with light intensity dependent on the stored heat, said second material comprising a plurality of fluorescent compounds, each able to re-emit the light by fluorescence with a different wavelength.

16. The method according to claim 15, wherein the acts of forming comprise applying a sprayable solution in which said first and second materials are homogeneously mixed, to form a coating of a homogeneous mixture of said first and second materials.

17. The method according to claim 15, wherein the acts of forming comprise successively applying a first sprayable solution comprising said first material and a second sprayable solution comprising said second material on the first solution applied, to form a structure of superposed coatings of said first and second materials.

18. The method according to claim 15, wherein the firming acts comprise applying a deposition solution in which said first and second materials are mixed, to form a coating of a homogeneous mixture of said first and second materials.

19. The method according to claim 16, wherein the forming acts comprise successively applying a first coating of said first material and a second coating of said second material on said first coating, to form a structure of superposed coatings of said first and second materials.

* * * * *

UNITED STATES PATENT AND TRADEMARK OFFICE
CERTIFICATE OF CORRECTION

PATENT NO. : 11,112,443 B2
APPLICATION NO. : 16/650753
DATED : September 7, 2021
INVENTOR(S) : Bobo et al.

It is certified that error appears in the above-identified patent and that said Letters Patent is hereby corrected as shown below:

On the Title Page

Item (73) Under Assignee:
Please delete "OFFICE NATIONAL D'ETUDES ET DE RECHERCHES AEROSPATIALES, Palaiseau (FR)" and insert therefor --OFFICE NATIONAL D'ETUDES ET DE RECHERCHES AEROSPATIALES, Palaiseau (FR); INSTITUT NATIONAL DES SCIENCES APPLIQUEES DE TOULOUSE, Toulouse (FR); CENTRE NATIONAL DE LA RECHERCHE SCIENTIFIQUE, PARIS (FR)--.

Signed and Sealed this
Third Day of May, 2022

Katherine Kelly Vidal
*Director of the United States Patent and Trademark Office*